United States Patent
Shen

(10) Patent No.: US 12,388,448 B2
(45) Date of Patent: Aug. 12, 2025

(54) PHASE LOCK LOOP WITH AN ADAPTIVE LOOP FILTER

(71) Applicant: Intel Corporation, Santa Clara, CA (US)

(72) Inventor: Kuan-Yueh Shen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 732 days.

(21) Appl. No.: 17/482,015

(22) Filed: Sep. 22, 2021

(65) Prior Publication Data

US 2023/0092886 A1  Mar. 23, 2023

(51) Int. Cl.
*H03L 7/093* (2006.01)
*H03L 7/08* (2006.01)
*H03L 7/089* (2006.01)

(52) U.S. Cl.
CPC ............ *H03L 7/093* (2013.01); *H03L 7/0802* (2013.01); *H03L 7/089* (2013.01)

(58) Field of Classification Search
CPC ....... H03L 7/0802; H03L 7/089; H03L 7/093; H03L 7/107; H03L 7/1075
See application file for complete search history.

(56) References Cited

U.S. PATENT DOCUMENTS 8,901,994 B2    12/2014  Fan
10,574,243 B2   2/2020   Shen et al.
10,700,688 B1   6/2020   Fan et al.
2018/0191359 A1* 7/2018  Petrov ............... H03L 7/0891
2020/0195255 A1 6/2020   Fan et al.

OTHER PUBLICATIONS

Maxim, Adrian et al., "A Low-Jitter 125-1250-MHz Process-Independent and Ripple-Poleless 0.18-um CMOS PLL Based on a Sample-Reset Loop Filter", IEEE Journal of Solid-State Circuits, vol. 36, No. 11, Nov. 2001, 11 pgs.
Shen, Kuan-Yueh et al., "A Flexible, Low-Power Analog PLL for SoC and Processors in 14nm CMOS", IEEE Transactions on Circuits and Systems—I: Regular Papers, vol. 65, No. 7, Jul. 2018, 9 pgs.
Shen, Kuan-Yueh James et al., "A 0.17-to-3.5mW 0.15-t0-5GHZ SOC PLL With 15dB Built-In Supply Noise Rejection and Self-Bandwidth Control in 14nm CMOS", ISSCC 2016, Session 19, Digital PLLs, 19.4, 3 pgs.
European Search Report and Search Opinion, EP App. No. 22190037.6, Feb. 20, 2023, 12 pages.
Lim, P. J., "An Area-Efficient PLL Architecture in 90-nm CMOS", Symposium on VLSI Circuits Digest of Technical Papers, Jun. 16, 2005, pp. 48-49.
Office Action, EP App. No. 22190037.6, Jul. 3, 2025, 6 pages.

\* cited by examiner

*Primary Examiner* — Patrick O Neill
(74) *Attorney, Agent, or Firm* — NICHOLSON DE VOS WEBSTER & ELLIOTT LLP

(57) ABSTRACT

An apparatus has a phase lock loop with an adaptive loop filter that has a reset circuit controlled by a power gating pulse circuit.

25 Claims, 9 Drawing Sheets

PHASE LOCK LOOP WITH AN ADAPTIVE LOOP FILTER

BACKGROUND

A phase locked (or lock) loop (PLL) is a clock control system to provide an output signal with a phase related to the phase of the input signal, often used to control an oscillator. One conventional PLL configuration uses a sample-reset loop filter (SR-LF) that resets capacitors on the loop filter circuit to avoid memory effect that could undesirably reduce the PLL phase margin or stability causing higher variation of PLL lock time, or more frequency ripples in a PLL phase step response. The known reset circuits used by the SR-LF, however, often are very inefficient consuming much more power than necessary, and overly expensive due to the type of components (e.g., precision resistors which may add significant manufacturing process costs) on the circuit as well as the typical required footprint size needed for the reset circuit.

BRIEF DESCRIPTION OF THE DRAWINGS

The implementations of the disclosure will be understood more fully from the detailed description given below and from the accompanying drawings of various implementations of the disclosure, which, however, should not be taken to limit the disclosure to the specific implementations, but are for explanation and understanding only.

DETAILED DESCRIPTION

Figures 1, 6:
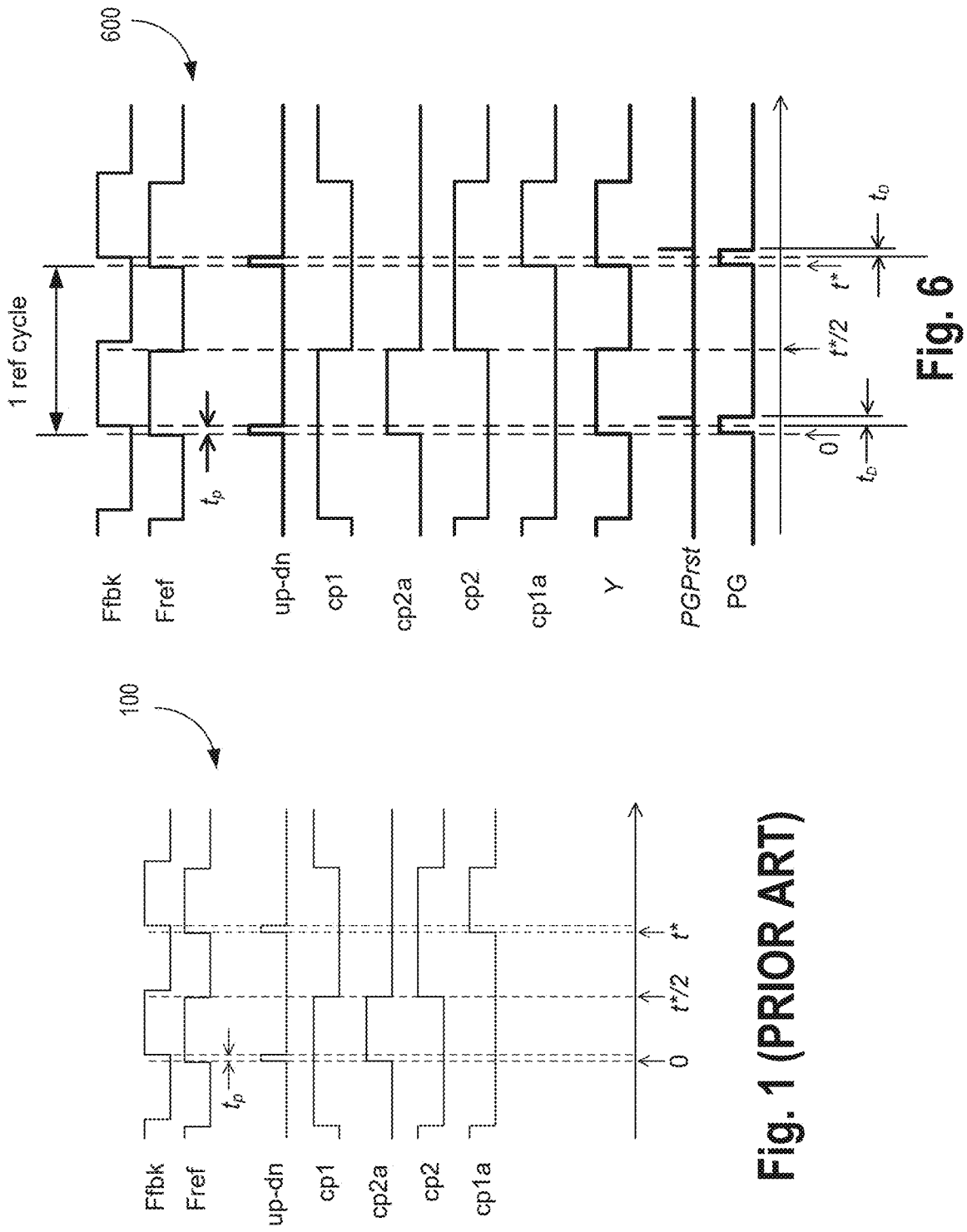
FIG. 1 is a timing diagram of a conventional SR-LF for a phase lock loop.
FIG. 6 is a timing diagram of an example phase lock loop according to at least one of the implementations herein.

Embodiments discussed herein variously provide techniques and mechanisms for regulating operation of a PLL circuit. In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" refers to a direct connection, such as electrical, mechanical, or magnetic connection between the things that are connected, without any intermediary devices. The term "coupled" refers to a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within ±10% of a target value. For example, unless otherwise specified in the explicit context of their use, the terms "substantially equal," "about equal" and "approximately equal" mean that there is no more than incidental variation between among things so described. In the art, such variation is typically no more than ±10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms may be employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

With recent advancements in System-on-Chip (SoC) integration, modern SoC architectures can employ many PLLs (e.g., more than 20 PLLs). However, SoC clocking has an ever reducing power budget, and conventional PLLs are known to consume too much power. Specifically, conventional semiconductor chip PLLs, such as phase lock loops that provide low jitter and receive a reference signal and feedback signal. A phase frequency detector (PFD) detects a phase difference or error between the signals and provides UP and DOWN (DN) signals to indicate the phase difference. Charge pumps may receive the UP and DN signals to generate control voltage provided to the loop filter.

Sample-reset loop filters (SR-LFs) have an integral path and a proportional path. The proportional path uses charge that is proportional to the phase difference between the reference and feedback signals (or clocks). A dual charge pump architecture in PLLs with low jitter highly decouples the proportional and integral control. The proportional control resets charges at capacitors in the proportional path in the SR-LF to erase memory effect per reference cycle. If the reset is incomplete due to insufficient reset current or reset duration where the capacitors do not return to their initial voltage in a reference cycle, the PLL does not reach a steady state and will need more reference cycles to reach the steady state (or achieve a longer lock time).

Older SR-LF PLLs use unity gain buffer (UGB) reset circuits with dynamic input and output range and that typically resets two alternating capacitors. The UGB reset circuits have more recently been replaced and simplified by reset circuits that use resistors or voltage dividers and improve upon the UGB in terms of reduced power consumption, as well as a smaller and less complex circuit. For example, the resistor divider reset circuit power gates the high reset current so that the resistor divider's ON time is duty cycled down to about half or 51% of the reference cycle before a next charge pump sampling window opens, which saves current relative to the UGB reset circuit, but is still considered wasteful.

Referring to FIG. 1 for example, a time chart 100 shows the conventional reset timing during SR-LF operation of a PLL. The PLL reference and feedback signals or clocks are shown with frequencies $F_{ref}$ and $F_{fbk}$ respectively. A net up-dn signal on time chart 100 represents the net phase difference or phase error pulse where the UP signal is the rising edge of a leading pulse of one of the reference and feedback signals, here being the reference signal, and where the DN signal of the net up-dn signal is the rising edge of the trailing pulse, here being the feedback pulse. The UP and DN signals are generated by a phase frequency detector (PFD) of the PLL, and the up-dn signal represents an XOR(up, dn) operation (only for the $F_{ref}$ & $F_{fbk}$ rising edges) where a pulse width $t_p$ of the net up-dn signal represents a phase error or difference.

Clocks cp1 and cp2 are charge pump sampling clocks that open and close sampling switches on a loop filter of the PLL to show the timing to provide charge to a proportional path of the loop filter. Clocks cp1a and cp2a are reset clocks that activate a reset circuit of the loop filter to open and close reset switches that provide current to two capacitors on the proportional path. All four of these clocks are conventionally derived from the PLL reference clock, and all run at $F_{ref}/2$ in this case. Time at 0, as well as at t*, begins the present and subsequent charge pump events, which refers to pumping charge to both of the integral and proportional paths of the loop filter.

The timing chart 100 also shows the alternating operation to provide current to the two parallel lines forming the proportional path so that while one line receives pumped charge to provide a control signal, the other line performs a capacitive reset to voltage $V_{RST}$ in some configurations. Most relevant here, the reset durations show, by the pulse widths on the reset clocks cp1a and cp2a, that the resets are conventionally set to be sustained for about half of the reference cycle. The reset duration, however, only needs to fully reset nodes (on the parallel lines interconnecting the parallel lines to the reset switches) back to $V_{RST}$ before the reset switches disconnect, respectively. Thus, the extra resetting time wastes power with the high pulse on cp1a and cp2a that each lasts about 25% of the reference cycle.

In addition, given the reference frequency $F_{ref}$, the PLL changes its feedback divide ratio N to support dynamic frequency scaling accomplished by using a frequency divider on the feedback of the PLL. If the charge pump current can be linearly proportional to N, the PLL maintains its loop stability and bandwidth. In such a configuration, the higher the N ratio, the more charge is pumped to the capacitors of the proportional path (assuming similar PLL phase errors, or up-dn pulse widths, across N's), thus requiring a higher reset current to fully reset the proportional path capacitors across the range of possible values for the N ratios. Since the high N scenario decides the high reset current for N of any value, for a low N ratio (such as down to four), the high reset current wastes more power.

Specifically, when a PLL is controlling a voltage controlled oscillator (VCO), the output frequency $F_{vco}$ (from the VCO) can trend between about 400 MHz to 6+ GHz. In this case, the same reset current in the SR-LF is adequate at high frequencies toward the 6 GHz, but when the output frequency $F_{vco}$ is low towards the 400 MHz and the reset current is kept the same, then the reset current is way too excessive for the lower frequency output $F_{vco}$, thereby wasting a relatively large amount of power. However, the reset current also cannot remain at a fixed low level because if the reset current is tuned too low, the PLL is known to have stability problems at the high output frequencies $F_{vco}$. In order to conventionally avoid this latter difficulty then, discrete reset current levels are increased, thereby wasting power for PLL stability at high output frequencies.

More specifically, a charge pump-based PLL at a minimum output frequency $F_{min}$ of 0.4 GHz with $F_{ref}$ at 100 MHz has SR-LF power consumption of about 220 μA at a nominal corner, or 39% of the total PLL power from the PLL supply voltage $V_{ccpll}$. In addition to the reasons mentioned above, this power drain should be reduced since additional SR-LF power does not increase PLL performance, such as by lowering PLL output phase noise or jitter.

Thus, such conventional PLL devices have loop filters with fixed reset current that is not adaptive to changes in phase error, output frequencies, and charge pump strength, which wastes a large amount of power relative to certain types of circuits such as those on semiconductor chips.

To resolve these issues, some implementations described herein are realized by a power gating pulse circuit that provides reset control signals to a reset circuit of a sample-reset loop filter in order to reset capacitors on the proportional path of the loop filter. The reset control signals have significantly shorter pulse widths as little as 10% or less of the reference signal or clock, and even down to about 3-4%. Since the reset time and power consumed by the reset circuit is based on pulse widths of reset control signals that adapt to the PLL phase error, this significantly reduces power consumption by the loop filter, and in turn, the phase locked loop (PLL) using the loop filter.

By some implementations, this is accomplished by an apparatus, system, or device with a loop filter to receive input and to output a control signal based on the input. The loop filter comprises capacitors coupled to the input and a reset circuit to reset the capacitors. A power gating pulse circuit comprises pulse generator circuitry (whether a flip-flop or equivalent circuitry) configured to adaptively generate complimentary reset control signals to control the reset circuit, where a pulse width of the reset control signals is based on both (1) a phase error between a reference clock and a feedback clock associated with the input to the loop filter and (2) switch control signals based on the reference clock. This arrangement effectively modifies or reduces the pulse widths of those switch control signals.

By some implementations, a phase frequency detection (PFD) reset signal is based on the detection of the phase error by the PFD, and the available PFD reset signal is provided to a power gating pulse circuit. The power gating pulse (PGP) circuit may have a delay circuit to delay the PFD reset signal to generate a PGP (or flip-flop) reset signal. The PGP circuit also may have flip-flop circuitry with a flip-flop (or by one example, a D-type flip-flop) that is reset by the flip-flop reset signal to generate the termination of the pulses of the loop filter reset control signals. The flip-flop also may receive input from a Boolean circuit that converts switch control signals to the input of the flip-flop to generate the start of the pulses of the reset control signals. The switch control signals are the reset clocks that have pulse widths that are a fixed proportion of the reference clock.

By other implementations, the reset circuit is an active element voltage divider that uses at least, or exactly, four transistors, rather than resistors, to receive the reset control signals. (it doesn't provide the signals to other blocks.)

These arrangements significantly reduce the reset duration at the loop filter as controlled by the reset control pulses. Also, the reset current can be realized by using a certain arrangement of the active devices in the reset circuit rather than using the resistor divider, which actually may increase the current while further reducing the reset duration, and still save power. This saves SR-LF power without increasing PLL jitter (or noise) or lock time. The reset configuration reduces the power consumed despite operation of a frequency divider for example. Also, the reset ON time becomes adaptive to the phase error, or in other words, a PFD up-dn net pulse width. For instance, if the phase error is larger at lower N with a lower change pump current, the reset ON time tracks it automatically. In one form, the disclosed PLL may save up to about 69% of the loop filter power, and up to about 27% of the PLL power at a minimum frequency of 400 MHz (and from supply current $I_{vccpll}$) at a nominal corner with a 100 MHz reference.

Figure 2:
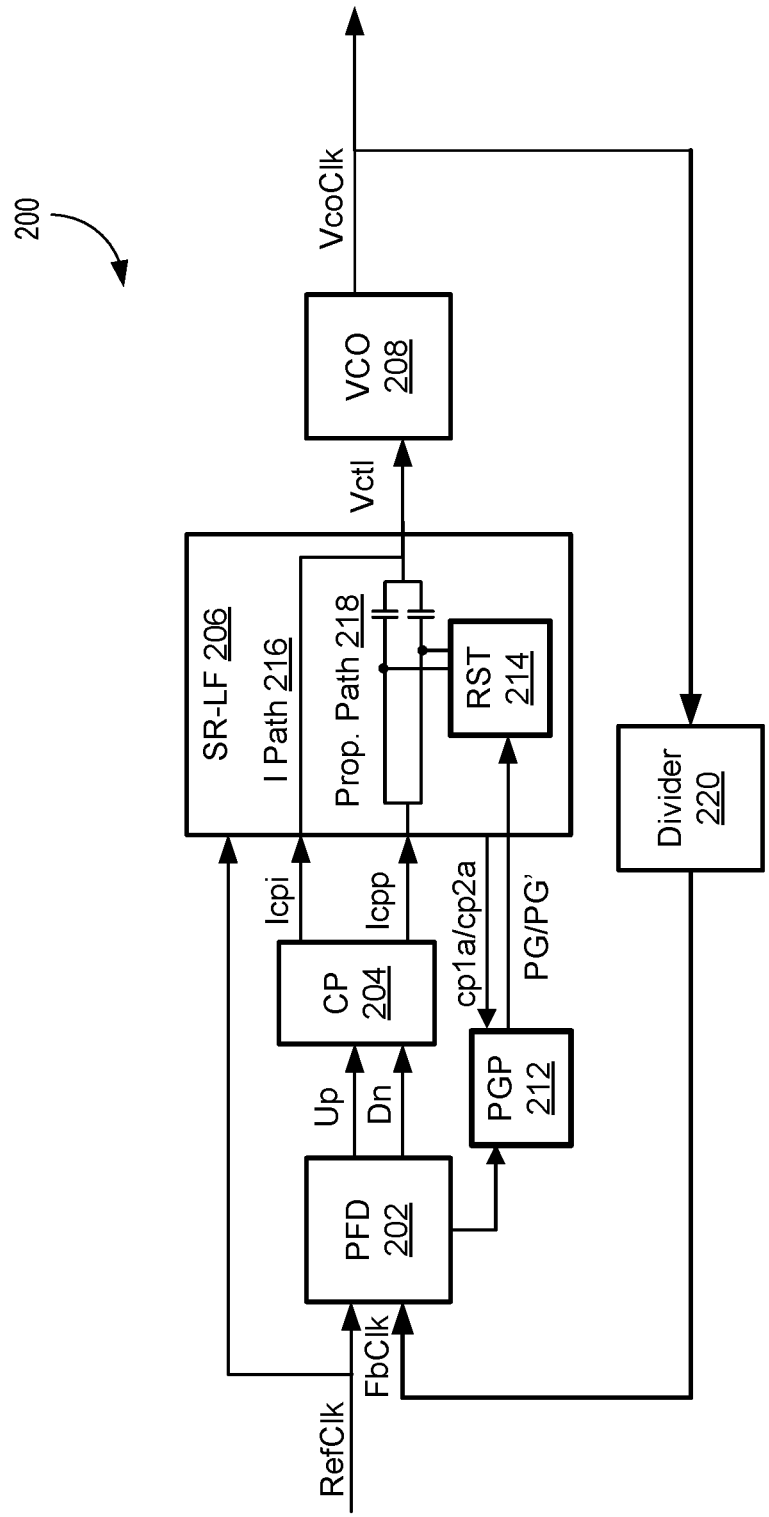
FIG. 2 is a schematic diagram of an example phase lock loop according to at least one of the implementations herein.

Referring to FIG. 2, a device or system 200 may be a phase locked (or lock) loop) PLL and the implementations described herein treat the device 200 as a PLL. The PLL described herein may be a type I or type II PLL with a sample-reset loop filter (SR-LF) 206 with a proportional path, but could be other types of PLLs, or the device 200 even could alternatively be a delay locked loop (DLL), as long as a charge pump provides proportional control and resets are provided per reference cycle.

For the present example, PLL 200 may have a phase frequency detector (PFD) 202, one or more charge pumps 204, the sample-reset loop filter (SR-LF) 206 with a reset circuit 214, an integral path 216, and a proportional path 218, and a device being controlled or regulated (for frequency and/or phase) by the PLL such as a voltage control oscillator (VCO) 208. The PLL also has a power gating pulse (PGP) circuit 212 to generate reset control signals with particular pulse widths as described herein. A feedback loop of the PLL may have a divider 220 to provide feedback with a variety of frequencies.

The PFD 202 receives a reference clock signal or just reference clock RefClk with a frequency of $F_{ref}$. The reference clock may be generated by any adequate known clock generation circuitry, such as a crystal oscillator, or another PLL (forming PLLs in cascade). A feedback signal or clock FbClk with a frequency $F_{fbk}$ also is received to determine the phase difference, if any, between the feedback and reference frequencies. The feedback signal is looped from the output of a device being controlled by the PLL, such as the voltage controlled oscillator (VCO) 208.

The PFD 202 has circuitry to detect a phase difference or error between the reference and feedback signals, and forms an UP signal and a down DN signal. The UP and DN signals are then provided to a charge pump circuit 204. The charge pump circuit 204 provides an integral path current $I_{cpi}$ to the integral path 216 of the SR-LF 206 and a proportional current $I_{cpp}$ to the proportional path 218, where charging and/or discharging time utilizing $I_{cpi}$ and $I_{cpp}$ is proportional to the phase error.

The power gating pulse (PGP) circuit 212 receives the PFD reset signal from the PFD circuit 202 as well as reset switch control signals cp1a and cp2a generated within the SR-LF 206 by sourcing and using the reference clock RefClk, for example. The reset switch control signals cp1a and cp2a are derived from RefClk, as disclosed by Maxim, A., et al., "A Low-Jitter 125-1250 Mhz Process Independent and Ripple-Poleless 0.18 μm CMOS PLL Based on a Sample-Reset Loop Filter, IEEE Journal of Solid-State Circuits, Vol. 36, No. 11, (November 2001), which is incorporated herein for all purposes.

The PGP circuit outputs reset control signals (or power gating (PG/PG') signals, and provides them to the reset circuit 214. The reset circuit 214 resets the energy or charge storage elements or here, capacitors, on the proportional path 218 depending on the pulse widths of the PG and PG' signals. The SR-LF then provides a control signal $V_{ctl}$ to adjust the frequency of the VCO 208.

The divider 220 divides the clock or signal output from the VCO 208, and divided down in frequency (e.g., divide by ratio 'N'). Other parallel feedback lines could be used with different divider ratio values (but only one of the feedback lines returns to PFD 202 as the FbClk). In some implementations, the divider may be an integer divider or a fractional divider. The divider can be implemented using any suitable divider circuitry. For example, Johnson Counters can be used for implementing dividers.

Figure 3:
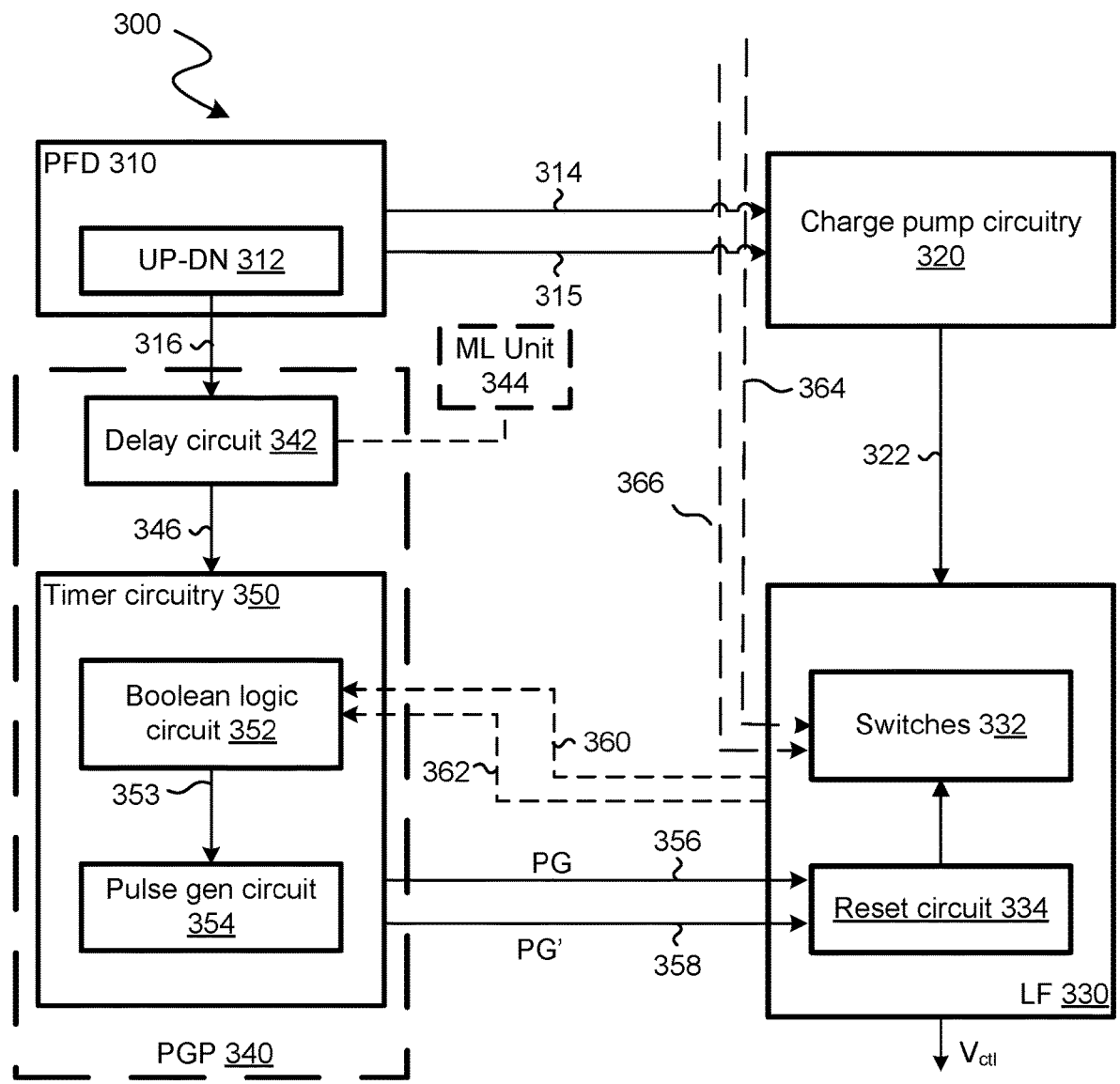
FIG. 3 is another diagram of an example phase lock loop according to at least one of the implementations herein.

Referring to FIG. 3, an apparatus, system, or device 300 provides more detail of the relevant circuits herein, and may be a PLL the same or similar to system 200. Here, the system 300 has a PFD, or PFD circuit, 310, charge pump circuitry 320, a loop filter 330, and a PGP circuit 340 (also referred to as a rapid reset circuit), all arranged as shown on FIG. 3. The PFD 310 receives the reference clock and feedback clock signals, which may be via one or more clock buffers to provide a delay when desired, and has an UP-DN circuit 312 that generates UP and DN signals 314 and 315 provided to charge pump circuitry 320. The charge pump circuitry 320 generates path control current which is provided to the loop filter 330. The loop filter 330 may have switches 332 including sample switches allowing charges from the charge pumps to a path on the loop filter and reset switches to erase the charges on capacitors on that path. The sample switches are closed depending on switch control signals 364 and 366 and are derived from the reference clock delivered to PFD 310. A reset circuit 334 controls the reset switches for the loop filter to output a control signal $V_{ctl}$ to drive a device being controlled, such as the VCO.

In order to provide the complimentary reset control signals PG/PG' 356 and 358 to the reset circuit 334, the PFD 310 also has the UP-DN circuit 312 that generates a PFD reset signal 316 to reset the UP-DN circuit 312 according to the phase error indicated by the UP and DN signals, and that is provided to a delay circuit 342 of the PGP circuit 340. Whether the delay of the delay circuit 342 is predetermined manually and fixed, or a state machine or machine learning (ML) unit 344 is able to adjust the delay, the delay circuit 342 applies the delay to the PFD reset signal 316 to generate a PGP (or flip-flop) reset signal 346.

The PGP reset signal 346 is provided to timer circuitry 350 that has a Boolean logic circuit 352 and a pulse generator circuit 354, which may be a flip-flop circuit that has one or more D-type flip-flop (D-FF)s. The Boolean logic circuit 352 receives reset switch control signals 360 and 362 from the loop filter 330 to set the start or rise of the reset control pulses PG and PG' 356 and 358. The Boolean logic circuit 352 generates a signal 353, such as a flip-flop input signal, received by the pulse generator circuit 354. When the pulse generator circuit 354 is a flip-flop circuit, the PGP reset signal 346 resets the flip-flop to generate the fall of the pulses of the reset control signal 356 and complimentary rise of reset control signal 358, and the reset control signals 356 and 358 are then provided to the reset control circuit 334. The pulse generator circuit 354 also may have an optional chopper branch or circuit to adjust or limit the pulse widths of the reset control signals when the phase error is longer than a certain threshold, for example half of a reference period. Those elements of FIG. 3 having the same reference numbers (or names) as the elements of any other figure can operate or function in any manner similar to that described, but are not limited to such. More details of system 300 are provided below.

Figure 4:
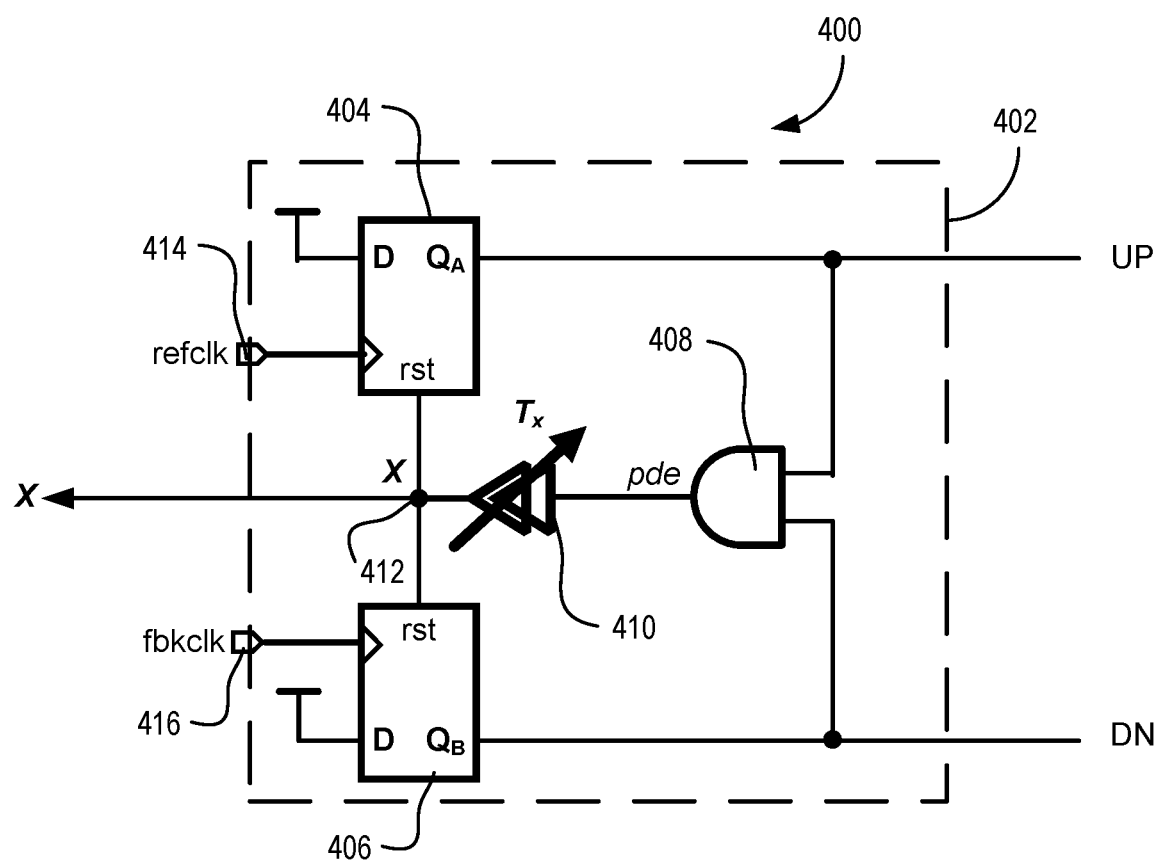
FIG. 4 is a diagram of an example phase frequency detector of a phase lock loop according to at least one of the implementations herein.

Referring to FIG. 4, an example PFD 400 has an UP-DN circuit 402, similar or the same as PFD 310 and UP-DN circuit 312, and may have any suitable circuitry. The example UP-DN circuit 402 here has at least a first or reference flip-flop 404, a second or feedback flip-flop 406, an AND gate 408, a PFD delay circuit (or internal delay) 410, a reset node 412, and clock inputs 414 and 416 to receive the reference signal refclk and feedback signal fbkclk as arranged as shown on FIG. 4. The reference flip-flop 404 and feedback flip-flop 406 respectively receive the reference signal refclk and feedback signal fbkclk at clock inputs of the flip-flops 404 and 406. The flip-flops 404 and 406 may be D-type flip-flops where the D input is set at HIGH. The flip-flop 404 may have an output $Q_A$ to provide the UP signal or pulse, and a reset coupled to node 412, while flip-flop 406 may have an output $Q_B$ to provide the DN signal or pulse, and also has a reset coupled to node 412. The UP and DN signals are provided to the charge pump circuitry 320.

Referring again to FIG. 3, the charge pump circuitry 320 may have any suitable circuitry known to use the UP and DN signals from the PFD 310 (or 400) to provide charge to the loop filter 330. By one form, the charge pump circuitry 320 may have dual charge pumps with an integral charge pump and a proportional charge pump that both receive the UP and DN signals and output charge pump positive or negative current depending on whether a received signal is the UP signal or DN signal. The charge pump circuitry 320 outputs one or more currents to loop filter 330, for example, wherein a current 322 at a control voltage Vctl is provided to one or more paths on the loop filter 330 as described below. The proportional, or the second, charge pump charges the voltage sample and reset node of the loop filter and also the output node of the second charge pump. The effect is that a charge pump charges or discharges at the node Vctl (FIG. 8) according to the UP and DN pulses from the PFD. A given conductance path of loop filter 330 accumulates charges proportional to the phase error whose sign is subject to whether UP or DN is leading and whose magnitude follows the pulse width of UP-DN. In some embodiments, a proportional path accepts charges like a corresponding integral path, but with usually a larger amount which is accumulated by a capacitor that must be discharged back or reset to its initial state before the next UP and DN event. Herein, the present SR-LF efficiently resets the charges in the proportional path.

Returning again to FIG. 4, the AND gate 408 of the UP-DN circuit 402 receives both UP and DN (or $Q_A$ and $Q_B$) signals or pulses. The UP and DN signals may have the same frequency but are out of phase from each other where the difference in rising edges is the phase error $t_p$ between the reference and feedback signals. The AND gate 408 primes when both UP and DN are high. The duration of that is controlled by the delay circuit or line Tx 410. Tx should be long enough to avoid dead zone issues.

Specifically, a phase difference end (pde) at output of the AND 408 is then provided to the PFD internal delay circuit 410 to add internal PFD delay Tx to form a residual pulse width. The delay circuit 410 may be formed of a delay line of a series of invertors or buffers by one example, although other configurations could be used. The delay circuit 410 effectively decides the pulse width of the residual pulse, or in other words, whichever is the narrower pulse between pulse $Q_A$ and $Q_B$, which then may be considered as residual pulse $Q_A$ or residual pulse $Q_B$. More precisely, a significant fraction of the narrower pulse or residual pulse is formed by Tx by adding delay to the pde signal. The residual pulse is provided at node X 412 to be provided to the flip-flops 404 and 406 to perform the PFD resets, so that the residual signal or pulse also may be considered the PFD reset pulse or signal. The residual pulse also may be referred to as the X pulse or signal. The PFD reset signal X may be generated once every reference cycle. The PFD reset signal X is then provided to the PGP circuit 340 to represent the end of the phase difference between the reference and feedback signals.

Note that labels for nodes and signals on those nodes are interchangeably used. For example, $V_{ctl}$ may refer to voltage $V_{ctl}$ or node $V_{ctl}$ depending on the context of the sentence.

Figure 5:
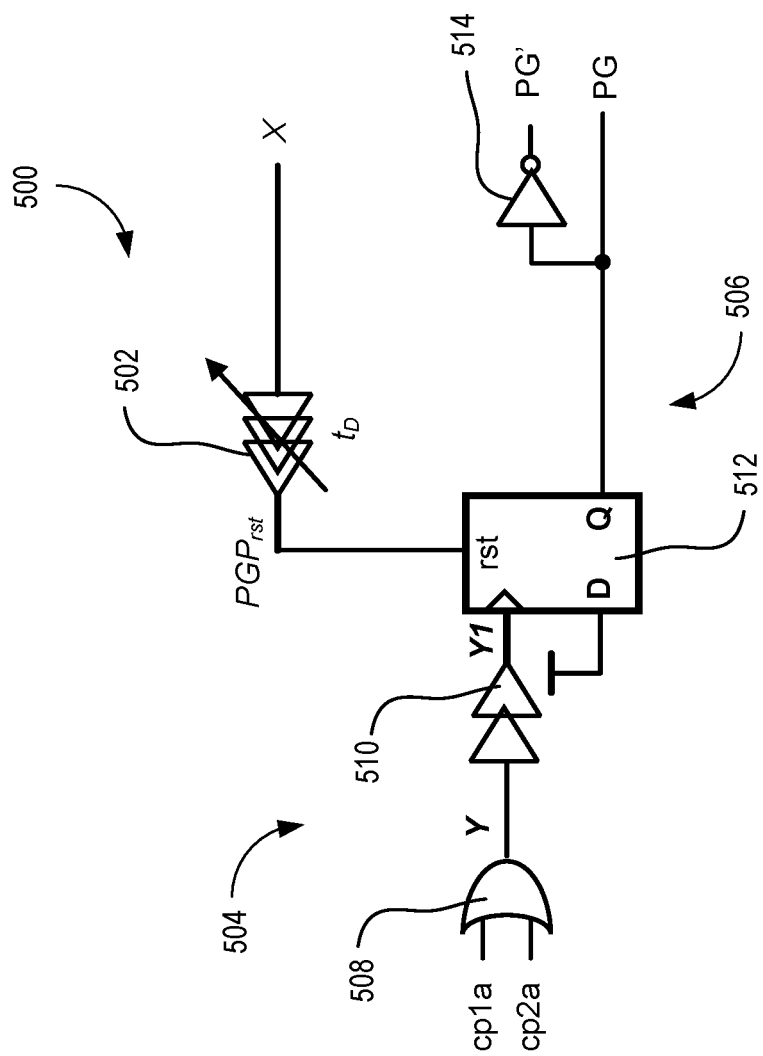
FIG. 5 is a diagram of an example power gating pulse circuit according to at least one of the implementations herein.

Referring to FIG. 5, an example PGP circuit (or rapid reset circuit) 500 is similar or the same as the PGP circuit 340, and receives the PFD reset signal X and switch control signals cp1a and cp2a to generate reset control signals PG and PG'. Those elements of FIG. 5 having the same reference numbers (or similar or same names) as the elements of any other figure can operate or function in any manner similar to that described, but are not limited to such. The PGP circuit 500 may have a delay circuit 502 as well as a Boolean logic circuit 504 and a pulse generator circuit (or flip-flop circuit) 506 to form the timer circuitry 350 (FIG. 3 for example).

The delay circuit 502 receives the PFD reset signal X and applies a delay $t_D$, to generate the PGP reset signal, or flip-flop reset signal, $PGP_{rst}$. The delay circuit 502 here may be a delay line with a series of invertors or buffers where each invertor adds a stage that causes a certain amount of delay, but other equivalent configurations may be used instead. The delay $t_D$ may be a tunable delay. Specifically, the number of delay stages may be programmable. In other words, the delay can be predetermined and tuned manually by selecting how many elements (invertors) or buffer stages (or delay stages) are to be active in series in the delay line in order to set a fixed delay duration. Here, about 200 ps may be used as the $t_D$ target. The number of stages, however, still can vary depending on the process skew corners as well as the specified supply voltage, and therefore the system may heuristically derive the correct number of stages.

By another form, the delay circuit 502 may be automatically tunable and a machine learning unit 344 (FIG. 3) may use a state machine to adapt the delay $t_D$ as is necessary. This may include having the state machine automatically monitor the PG pulse width by a background feedback loop. Alternatively, one or more pre-trained neural networks may receive phase error signal data as input and then output a desired time delay $t_D$ to adjust the PG pulse widths. Many variations are contemplated.

Referring to FIG. 6, the Boolean logic circuit 504 receives reset switch control signals cp1a and cp2a. As shown on the timing diagram 600 (FIG. 6), the reset switch control signals cp1a and cp2a may be the conventional reset control signals and are a proportion of the reference clock shown at frequency $F_{ref}$. Cp1, cp1a, cp2, and cp2a are non-overlapping clocks all with a period of ½Fref [2 times the period of Fref]. The switch control signals cp1a and cp2a alternate every reference cycle (cp1a→cp2a→cp1a→ . . . ) where cp1a or cp2a is HIGH for one-half a reference cycle. Together signals cp1a and cp2a have a pulse width about 50% of the reference cycle. The feedback clock $F_{fbk}$ is shown to trail the reference clock at a phase difference or phase error $t_p$. A net UP-DN pulse also is shown that corresponds to the phase error and is the difference in the rising edges of the UP pulse ($Q_A$) and DN pulse ($Q_B$) generated by the PFD 400. Sampling switch control signals cp1 and cp2, which maybe generated by the SR-LF or PFD, and not necessarily the charge pumps, also are shown with alternating pulses to show the alternating operation of capacitors C2a and C2b on the proportion path of the loop filter 330, where while one capacitor, say C2a, is receiving charge (from Icpp), the other capacitor C2b is being reset.

Referring again to FIG. 5, the Boolean circuit 504 may have an OR gate 508 to receive the reset switch control signals cp1a and cp2a and output a signal Y that has a rising edge that indicates the rise of either switch control signal, and the Y rising edge occurs once every reference cycle. Two or more buffers in series 510 then may delay the Y signal to generate a signal Y1 in order to adjust the timing to flop HIGH from D to Q of a D-type flip-flop (D-FF) 512. The delay of Y1 relative to Y postpones the onset time of the proportional charge reset process. When the delay is optimal, voltage ripple due to resetting, say capacitor C2a, may cancel the voltage ripple due to charging capacitor C2b. Such cancellation leads to low perturbation coupling onto Vctl, resulting in lower VCO frequency fluctuation or deterministic jitter.

On the pulse generating circuit 506, the D-type flip-flop 512 has a reset input that resets output Q to LOW. The D input is held at HIGH. The flip-flop 512 has a reset that is activated by the PGP reset signal $PGP_{rst}$. The output Q of the flip-flop 512 is the reset control pulse PG that is to be provided to the reset circuit 334 of the loop filter 330. It will be appreciated that in alternative forms, the flip-flop could be a different type, or the D-type flip-flop could be replaced by components that perform equivalent operations. The reset control signal PG then may be inverted by an inverter 514 to also provide a complimentary reset control signal PG' to the reset circuit 334.

Referring again to FIG. 6, the timing diagram 600 shows the reset power gating by the reset control pulses. A plot of signal Y (and in turn representing Y1) is shown, where Y is HIGH whenever cp1a or cp2a is HIGH. A plot of the PGP reset signal $PGP_{rst}$ also is shown. As indicated, Y sets the rising edge of the reset control pulses PG, while the PGP reset signal $PGP_{rst}$ sets the falling edge of the reset control pulse PG. As mentioned above with clock buffers, the reset control pulse PG actually may have its rising edge start very slightly before the charge pump event and therefore, before the rise of the UP-DN net signal. Otherwise, the charge pump event and the rise of the loop filter reset can happen almost simultaneously to help cancel the coupling from each other and onto Vctl.

It can be seen that the PG pulse width extends beyond $t_p$ by the delay $t_D$, and this is accomplished by adding $t_D$ to the PFD reset signal or pulse, which also may be the residual pulse $Q_B$ from the PFD (assuming $Q_B$ is the narrower one relative to $Q_A$), as explained above. The result is that when the PLL locks and exhibits a typical PFD up and down pulse duty cycle of about 1%, a corresponding PG pulse, and thus the reset current, has a steady-state duty cycle as small as about 3% (subject to the delay $t_D$), but by one form, by about 10% or less. This reset duration reduction significantly reduces the SR-LF reset power since the reset control signals PG have a pulse width that is about 17 times to 5 times shorter than the conventional pulse width of cp1a and cp2a.

Figure 7:
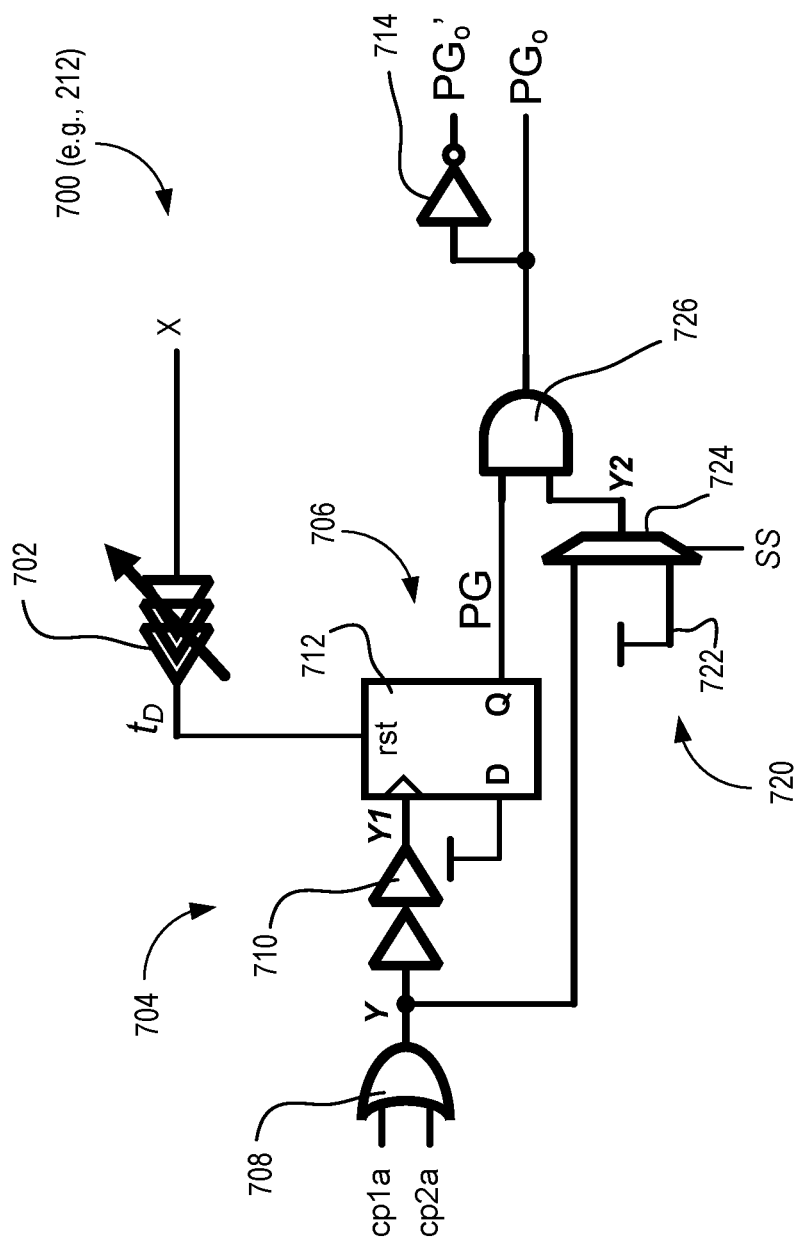
FIG. 7 is a diagram of an alternative example power gating signal circuit according to at least one of the implementations herein.

Referring now to FIG. 7, an alternative power gating pulse (PGP) circuit (or rapid reset circuit) 700 may be the same or similar to PGP circuit 500 except with an optional chopper branch or circuit 720. For example, PGP circuit 700 also has a delay circuit 702 with buffers 710, a Boolean circuit 704, and a pulse generator circuit 708 with a flip-flop 712. Otherwise, those elements of the PGP circuit 700 having the same or similar reference numbers (or similar or same names) as the elements of any other figure can operate or function in any manner similar to that described, but are not limited to such. Thus, the components of PGP circuit 700 already described on PGP circuit 500 need not be described again here.

The chopper branch or circuit 720 is provided to cut-off (or chop) the pulse width of PG when the phase error is greater than a threshold, which may be a proportion of a reference cycle, such as when the phase error $t_p$ is more than at least about 180 degrees, exactly 180 degrees, or half the reference cycle. Without the chopping, PG pulse width can exceed half the reference cycle, encroaching the sampling phase of the next reference cycle.

The chopper circuit 720 may have a node Y along the Y line in the Boolean circuit 704 to receive the Y signal at a mux 724 that is arranged to select between Y and a HIGH input 722, which may be tied to supply voltage $V_{ccpll}$. The mux 724 also may receive a static selection (SS) signal that selects either HIGH or Y for output Y2. The output Y2 of the mux 724 may be provided to an AND2 gate 726. Due to the timing of the rising edges of the Y pulses as explained above and as input to the mux, this indicates the reference cycle. When Y2 is HIGH, the output of the AND2 falls following the falling edge of the PG. When Y2 is Y, PG is simply passed through as is. The static selector (SS), or just Static, may be programmed to provide a fixed value, and otherwise, the circuit is arranged as shown on FIG. 7.

Figure 8:
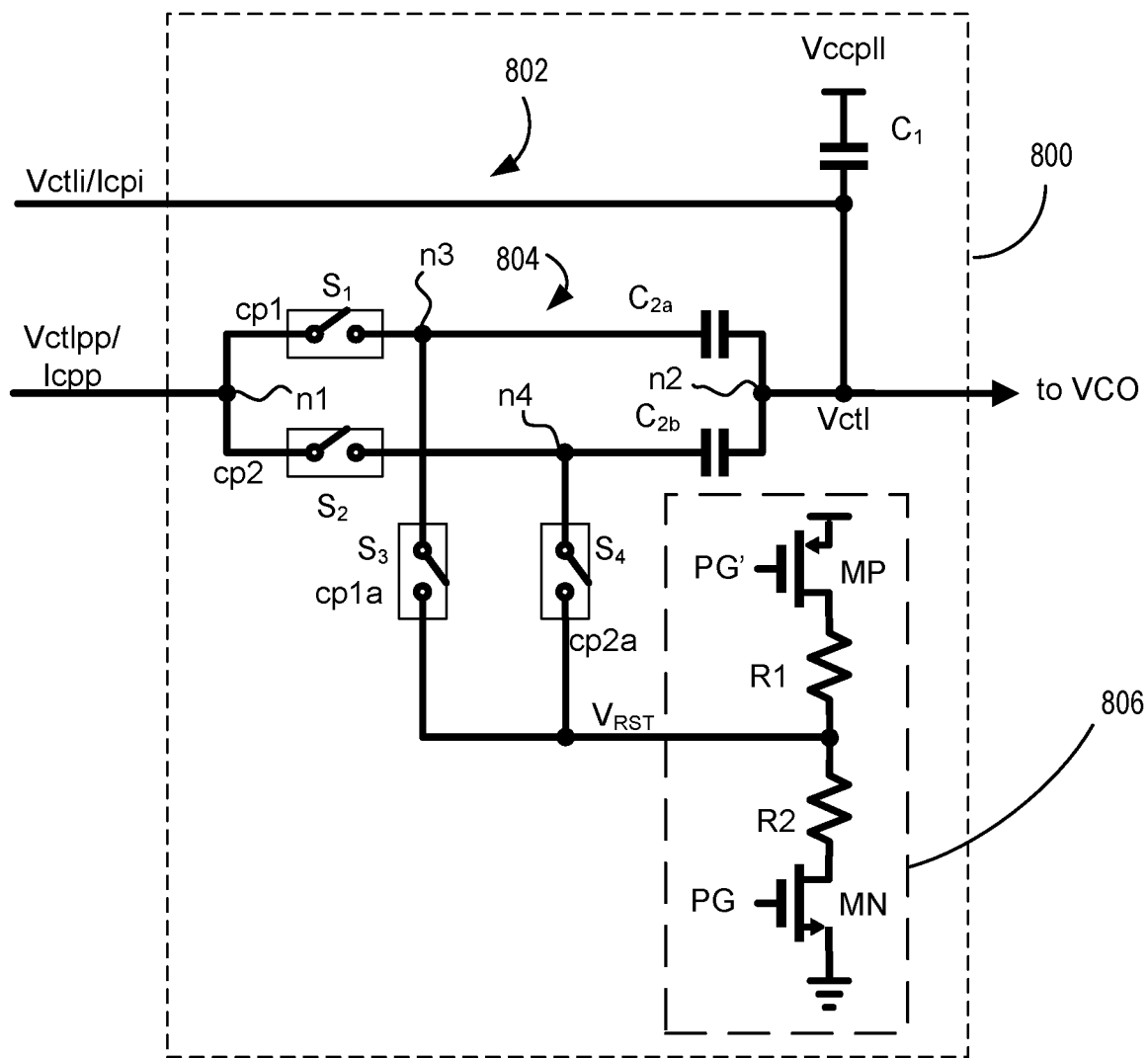
FIG. 8 is a diagram of an example loop filter according to at least one of the implementations herein.

Referring to FIG. 8, a loop filter 800 may be a sample-reset (SR) loop filter (SR-LF) the same or similar to loop filter 330 (FIG. 3). The SR-LF 800 uses the reset control signals PG and PG' from the PGP circuit 500 or 700 to reduce the reset duration of a proportional path. It is pointed out that those elements of SR-LF 800 having the same or similar reference numbers (or names) as the elements of any other figure can operate or function in any manner similar to that described, but are not limited to such.

In more detail, and in some implementations, sample-reset loop filter 800 has two import ports to receive pumped charge $V_{ctli}$ with current $I_{cpi}$ for an integral path 802, and proportional pumped charge $V_{ctlpp}$ with current $I_{cpp}$ to a proportional path 804. Both of them receive the charge proportional to the PLL phase error between the reference and feedback clocks. In each reference clock cycle, proportional charges deposited onto C2a or C2b from the previous reference cycle is reset to $V_{rst}$ during the present UP/DN event. The output signal $V_{ctl}$ may be received by a VCO to set or adjust the oscillating frequency of the VCO. In some implementations, a main loop capacitor $C_1$ is provided on the integral path 802 as shown and is instantiated between $V_{ccpll}$, the PLL supply, and $V_{ctl}$. In some implementations, the proportional path 804 is based on the sample and reset topology, but a reset circuit 806 may be modified to reset to Vccpll/2, or a different voltage level to improve proportional charge pump current matching between UP and DN.

The proportional path 804 is formed by sample-reset circuitry and comprises sample switches $S_1$ and $S_2$ controlled by sampling switch control signals cp1 and cp2, reset switches $S_3$ and $S_4$ controlled by switch reset signals cp1a and cp2a, and capacitive devices $C_{2a}$ and $C_{2b}$. Particularly, the capacitors $C_{2a}$ and $C_{2b}$ are each coupled to a charge pump via a first node n1, and are coupled in parallel with each other between the first node n1 and a second node n2. The sample switch $S_1$ is coupled between the capacitor $C_{2a}$ and the first node n1, while the sample switch $S_2$ is coupled between the capacitor $C_{2b}$ and the first node n1. Reset switch $S_3$ is coupled between the reset circuit 806 and a third node n3 between the capacitor $C_{2a}$ and the sampling switch $S_1$, while the reset switch $S_4$ is coupled between the reset circuit 806 and a fourth node n4 between the capacitor $C_{2b}$ and the sample switch $S_2$.

The main loop capacitor $C_1$ is coupled to the proportional path 804 as shown. $V_{rst}$ is a reset voltage which is generated by the reset circuit 806 and with a duration corresponding to, or approximately equal to, the shortened pulse widths of reset control signals PG and PG'. The reset signal $V_{rst}$ may be significantly smaller than Vccpll/2 for example, and in accordance with some implementations herein. Here, switch control signals cp1 and cp2 are derived from the reference clock as explained above. In some implementations, cp1 and cp2 signals are periodic at half of the reference clock rate as shown on timing diagram 600. In some implementations, cp1 and cp2 are for sampling and open switches S1 and S2 so that capacitors $C_{2A}$ and alternatively $C_{2B}$ are ready to take proportional charges.

By one approach, the reset circuit 806 uses a resistor divider with resistors R1 and R2. Specifically, by this approach, reset circuit 806 has transistors MP and MN, and resistors $R_1$ and $R_2$, which may be tunable, are coupled together as shown. Transistor MP is controlled by PG' while transistor MN is controlled by PG as obtained from the PGP circuit 500 or 700 for example. The reset control signals PG and PG' can turn the resistor divider off for a time before a pulse of the UP/DN signals. Promptly before and during the reset process, where $R_1$ and $R_2$ are connecting (or consuming DC bias current), PG/PG' also is HIGH/LOW.

In some implementations, the node of $V_{rst}$ may have a decoupling capacitor (not shown) to ground or $V_{ccpll}$ to mitigate timing mismatch induced Vrst fluctuation that mainly results from the ON time of transistors MN and MP. For example, when PG is HIGH but PG' is not yet LOW due to some timing mismatch (or any other reasons), then the $V_{ccpll}/2$ node may get immediately pulled low if there is no de-coupling capacitance connected to this VCC/2 node. With the decoupling cap, the instant voltage fluctuation when 806 begins to turn ON is mitigated, reducing the perturbation from $V_{rst}$ through C2a or C2b to $V_{ctl}$.

In each of the reset circuit examples shown herein, the reset control signal PG and PG' turns the reset current both on and off when the PG pulse first rises to HIGH and then drops back to LOW. Alternatively, reset switch control signals cp1a and cp2a could be provided to reset switches $S_3$ and $S_4$ to initiate the reset current (turning ON the reset current), while the falling edge of the switch control signal PG terminates the reset current.

Figure 9A:
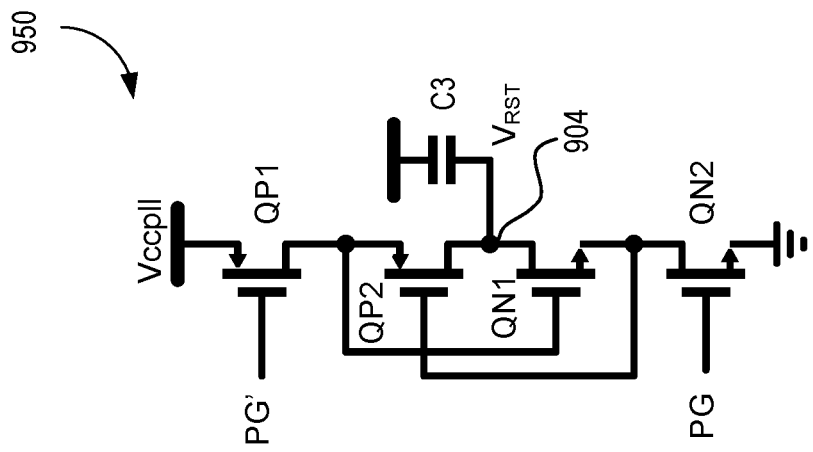
FIG. 9A is a diagram of an example loop filter reset circuit for proportional control according to at least one of the implementations herein.

Referring to FIG. 9A, an alternative reset circuit 900 to replace reset circuit 806 may further reduce power consumption and/or circuit area by replacing the passive element resistors with active elements (or devices) in a certain arrangement instead. In this case, reset circuit 900 is has a P-channel metal oxide semiconductor (PMOS) diode-connected transistor in conjunction with an N-channel metal oxide semiconductor (NMOS) diode-connected transistor. Specifically, reset circuit 900 may have a pair of PMOS transistors MP1 and MP2 coupled from drain to source as one branch, and a pair of NMOS transistors MN1 and MN2 coupled from drain to source as another branch with a junction of the two branches at node 902. The outer transistor MP1 may be coupled to supply voltage $V_{ccpll}$ at its source, and the outer transistor MN2 may be coupled to ground at its drain.

Inner transistors MP2 and MN1 of the two branches also are coupled from drain to source, and in a stacking arrangement. Node 902 is located along the coupling to provide gate voltage to the two inner transistors MP2 and MN1 as well as provide output reset voltage $V_{rst}$ to control the two reset switches $S_3$ and $S_4$. The outer transistors MP1 and MN2 receive the two reset control pulses PG and PG' as their gate voltage to activate the circuit and output $V_{rst}$ at pulse widths controlled by PG and PG'. The output $V_{rst}$ settles to a "trip voltage" of the PMOS pull-up and NMOS pull-down branches, which is not necessarily at Vccpll/2 as with reset circuit 806 (FIG. 8) and other conventional circuits. This arrangement generates a fast-settling reset current. It will be understood that the reset circuit acts as an inverter where the output is short to the input so that both the NMOS and PMOS transistors are acting in saturation mode. It also will be understood that the reset circuit 900 is self-biasing to bias MP2 and MN1 into a saturation mode. Also, the reset circuit 900 has tunable parallel multiples that change the reset current in proportion to the multiples.

The transistors may be sized so that the dc current is about 400 uA, as one example. Also, a decoupling capacitor C3 and supply voltage (or ground) can be provided on this reset circuit 900 as well and as described above with reset circuit 806. Here, the capacitor C3 may be coupled to the node 902 as well and at the output of the reset circuit providing the $V_{rst}$. The supply voltage may be tied to $V_{ccpll}$, but could be tied to $V_{ss}$ instead where a supply voltage pin is connected to a source of the transistor. Otherwise, instead of capacitor C3, two capacitors in series from $V_{ccpll}$ to $V_{ss}$ can be used where the junction node in the middle is tied to $V_{rst}$.

Figure 9B:
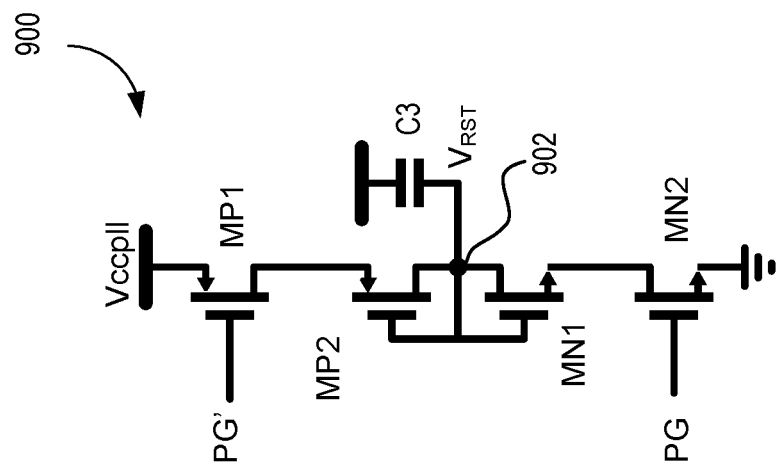
FIG. 9B is a diagram of an example alternative loop filter reset circuit for proportional control according to at least one of the implementations herein.

Referring to FIG. 9B, another alternative reset circuit 950 to replace reset circuit 806 has PMOS transistors QP1 and QP2, and NMOS transistors QN1 and QN2 in a linear mode instead, also similar to having two resistors in series. The reset circuit here also is self-biased, and can have tunable parallel multiples that changes the reset current. Thus, in this example, the four transistors QN1, QN2, QP1, QP2 are coupled drain to source in two branches as shown, and where the two branches are connected at a node 904, as with reset circuit 900. The two outer transistors QP1 and QN2 receive the reset control signals PG and PG' respectively at their gates. Different here, the inner transistors QP2 and QN1 each receive the voltage from the respective coupling between inner and outer transistors as their gate voltage. Otherwise, the structure is the same or similar to that of reset circuit 900 and the description of which does not need to be repeated here. The configuration of reset circuit 950 has the advantage of realizing high resistance by operating QP2 and QN1 in the linear mode.

It will be noted that the PLL of various implementations features a modular implementation and therefore can be used as the local clock source or as part of a clock-generation hub. The clock-generation hub provides reference clocks to subsystems from a single platform crystal oscillator through a combination of divisions and distributions, in accordance with some implementations.

For purposes of the implementations herein, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. It will be appreciated that other transistors, for example, Bi-polar junction transistors—BJT PNP/NPN, BiCMOS, CMOS, eFET, etc., may be used without departing from the scope of the disclosure.

Figure 10:
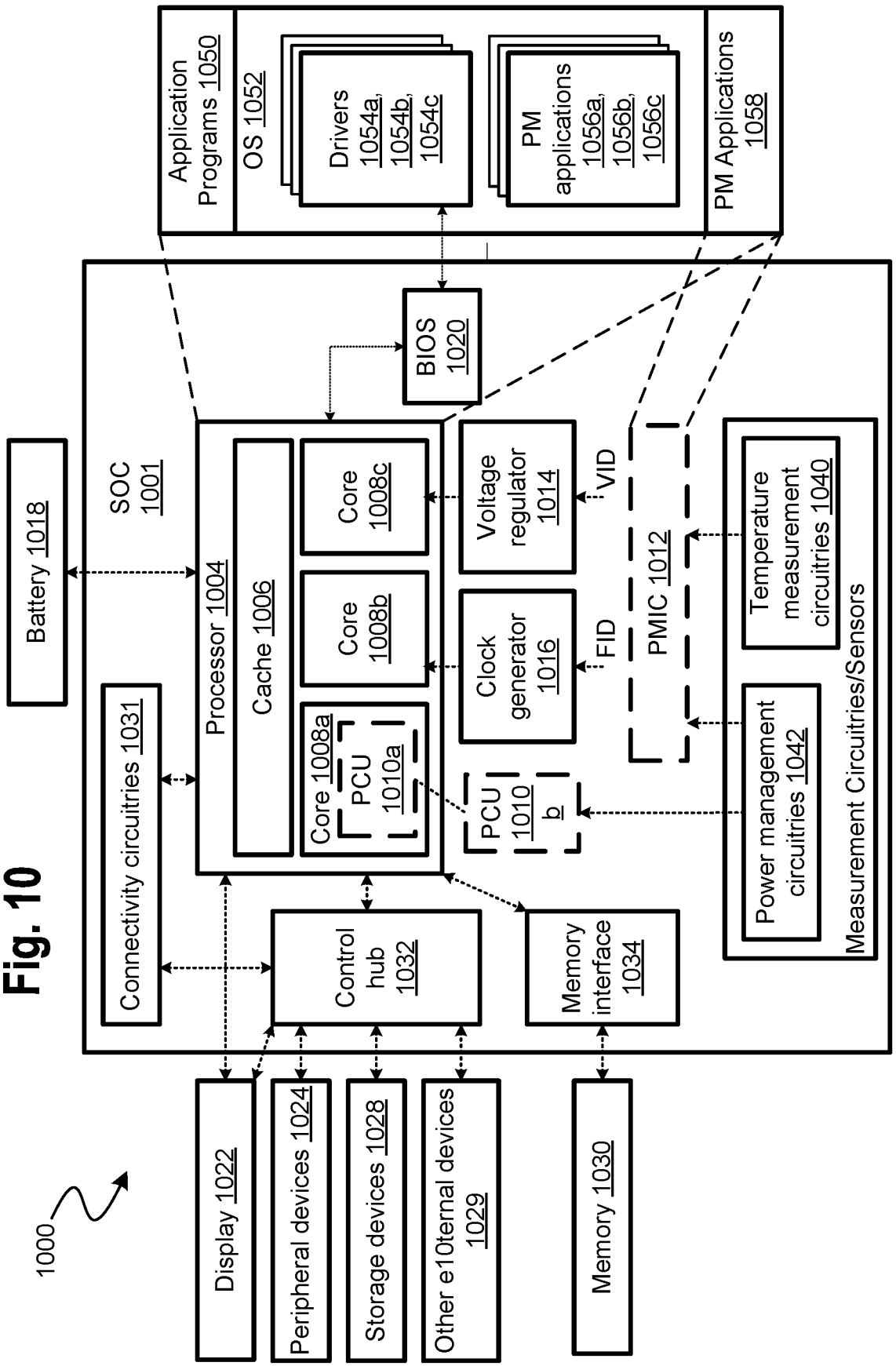
FIG. 10 is a schematic diagram of a system according to at least one of the implementations herein.

Referring to FIG. 10, a computer system or computing device 1000 (also referred to as device 1000) has a number of elements that may have, or may be operated by, a PLL (or DLL) such as PLL 200 (FIG. 2) or 300 (FIG. 3) in accordance with some implementations herein. For example, the PLL 200 has a power gating pulse circuit (or just pulse circuit) 212 (or 500 of FIG. 5) that provides reset control pulses to a reset circuit 214 (or 806, 900, or 950 of FIGS. 8-9B respectively). The pulse circuit 500 generates a time delay to add to a signal related to the phase error or up-dn signals of a phase frequency detector (PFD) 202 or 400 (FIG. 4). The time delay as well as initial switch control circuits input to the pulse circuit are used to generate short pulse widths for the reset control pulses before providing the reset control pulses to the reset circuit to control the proportional path of the loop filter as described above. One or more of the processors on device 1000 as well as the other elements forming device 1000 may have or operate the PLL 200 or 300 as described above. It is pointed out that those elements of FIG. 10 having the same reference numbers (or names) as the elements of any other figure can operate or function in any manner similar to that described, but are not limited to such.

In some implementations, device 1000 represents an appropriate computing device, such as a computing tablet, a mobile phone or smart-phone, a laptop, a desktop, an Internet-of-Things (JOT) device, a server, a wearable device, a set-top box, a wireless-enabled e-reader, or the like. It will be understood that certain components are shown generally, and not all components of such a device are shown in device 1000.

In an example, the device 1000 comprises a SoC (System-on-Chip) 1001. An example boundary of the SOC 1001 is illustrated using dotted lines in FIG. 10, with some example components being illustrated to be included within SOC 1001—however, SOC 1001 may include any appropriate components of device 1000.

In some implementations, device 1000 includes processor 1004. Processor 1004 can include one or more physical devices, such as microprocessors, application processors, microcontrollers, programmable logic devices, processing cores, or other processing means. The processing operations performed by processor 1004 include the execution of an operating platform or operating system on which applications and/or device functions are executed. The processing operations include operations related to I/O (input/output) with a human user or with other devices, operations related to power management, operations related to connecting computing device 1000 to another device, and/or the like. The processing operations may also include operations related to audio I/O and/or display I/O.

In some implementations, processor 1004 includes multiple processing cores (also referred to as cores) 1008a, 1008b, 1008c. Although merely three cores 1008a, 1008b, 1008c are illustrated in FIG. 10, the processor 1004 may include any other appropriate number of processing cores, e.g., tens, or even hundreds of processing cores. Processor cores 1008a, 1008b, 1008c may be implemented on a single integrated circuit (IC) chip. Moreover, the chip may include one or more shared and/or private caches, buses or interconnections, graphics and/or memory controllers, or other components.

In some implementations, processor 1004 includes cache 1006. In an example, sections of cache 1006 may be dedicated to individual cores 1008 (e.g., a first section of cache 1006 dedicated to core 1008a, a second section of cache 1006 dedicated to core 1008b, and so on). In an example, one or more sections of cache 1006 may be shared among two or more of cores 1008. Cache 1006 may be split in different levels, e.g., level 1 (L1) cache, level 2 (L2) cache, level 3 (L3) cache, etc.

In some implementations, a given processor core (e.g., core 1008a) may include a fetch unit to fetch instructions (including instructions with conditional branches) for execution by the core 1008a. The instructions may be fetched from any storage devices such as the memory 1030. Processor core 1008a may also include a decode unit to decode the fetched instruction. For example, the decode unit may decode the fetched instruction into a plurality of micro-operations. Processor core 1008a may include a schedule unit to perform various operations associated with storing decoded instructions. For example, the schedule unit may hold data from the decode unit until the instructions are ready for dispatch, e.g., until all source values of a decoded instruction become available. In one implementation, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an implementation, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an implementation, a co-processor (not shown) may perform various arithmetic operations in conjunction with the execution unit.

Further, an execution unit may execute instructions out-of-order. Hence, processor core 1008a (for example) may be an out-of-order processor core in one implementation. Processor core 1008a may also include a retirement unit. The retirement unit may retire executed instructions after they are committed. In an implementation, retirement of the executed instructions may result in processor state being committed from the execution of the instructions, physical registers used by the instructions being de-allocated, etc. The processor core 1008a may also include a bus unit to enable communication between components of the processor core 1008a and other components via one or more buses. Processor core 1008a may also include one or more registers to store data accessed by various components of the core 1008a (such as values related to assigned app priorities and/or sub-system states (modes) association.

In some implementations, device 1000 comprises connectivity circuitries 1031. For example, connectivity circuitries 1031 includes hardware devices (e.g., wireless and/or wired connectors and communication hardware) and/or software components (e.g., drivers, protocol stacks), e.g., to enable device 1000 to communicate with external devices. Device 1000 may be separate from the external devices, such as other computing devices, wireless access points or base stations, etc.

In an example, connectivity circuitries 1031 may include multiple different types of connectivity. To generalize, the connectivity circuitries 1031 may include cellular connectivity circuitries, wireless connectivity circuitries, etc. Cellular connectivity circuitries of connectivity circuitries 1031 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 1031 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 1031 may include a network interface, such as a wired or wireless interface, e.g., so that a system implementation may be incorporated into a wireless device, for example, cell phone or personal digital assistant.

In some implementations, device 1000 comprises control hub 1032, which represents hardware devices and/or software components related to interaction with one or more I/O devices. For example, processor 1004 may communicate with one or more of display 1022, one or more peripheral devices 1024, storage devices 1028, one or more other external devices 1029, etc., via control hub 1032. Control hub 1032 may be a chipset, a Platform Control Hub (PCH), and/or the like.

For example, control hub 1032 illustrates one or more connection points for additional devices that connect to device 1000, e.g., through which a user might interact with the system. For example, devices (e.g., devices 1029) that can be attached to device 1000 include microphone devices, speaker or stereo systems, audio devices, video systems or other display devices, keyboard or keypad devices, or other I/O devices for use with specific applications such as card readers or other devices.

As mentioned above, control hub 1032 can interact with audio devices, display 1022, etc. For example, input through a microphone or other audio device can provide input or commands for one or more applications or functions of device 1000. Additionally, audio output can be provided instead of, or in addition to display output. In another example, if display 1022 includes a touch screen, display 1022 also acts as an input device, which can be at least partially managed by control hub 1032. There can also be additional buttons or switches on computing device 1000 to provide I/O functions managed by control hub 1032. In one implementation, control hub 1032 manages devices such as accelerometers, cameras, light sensors or other environmental sensors, or other hardware that can be included in device 1000. The input can be part of direct user interaction, as well as providing environmental input to the system to influence its operations (such as filtering for noise, adjusting displays for brightness detection, applying a flash for a camera, or other features).

In some implementations, control hub 1032 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some implementations, display 1022 represents hardware (e.g., display devices) and software (e.g., drivers) components that provide a visual and/or tactile display for a user to interact with device 1000. Display 1022 may include a display interface, a display screen, and/or hardware device used to provide a display to a user. In some implementations, display 1022 includes a touch screen (or touch pad) device that provides both output and input to a user. In an example, display 1022 may communicate directly with the processor 1004. Display 1022 can be one or more of an internal display device, as in a mobile electronic device or a laptop device or an external display device attached via a display interface (e.g., DisplayPort, etc.). In one implementation display 1022 can be a head mounted display (HMD) such as a stereoscopic display device for use in virtual reality (VR) applications or augmented reality (AR) applications.

In some implementations and although not illustrated in the figure, in addition to (or instead of) processor 1004, device 1000 may include Graphics Processing Unit (GPU) comprising one or more graphics processing cores, which may control one or more aspects of displaying contents on display 1022.

Control hub 1032 (or platform controller hub) may include hardware interfaces and connectors, as well as software components (e.g., drivers, protocol stacks) to make peripheral connections, e.g., to peripheral devices 1024.

It will be understood that device 1000 could both be a peripheral device to other computing devices, as well as have peripheral devices connected to it. Device 1000 may have a "docking" connector to connect to other computing devices for purposes such as managing (e.g., downloading and/or uploading, changing, synchronizing) content on device 1000. Additionally, a docking connector can allow device 1000 to connect to certain peripherals that allow computing device 1000 to control content output, for example, to audiovisual or other systems.

In addition to a proprietary docking connector or other proprietary connection hardware, device 1000 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some implementations, connectivity circuitries 1031 may be coupled to control hub 1032, e.g., in addition to, or instead of, being coupled directly to the processor 1004. In some implementations, display 1022 may be coupled to control hub 1032, e.g., in addition to, or instead of, being coupled directly to processor 1004.

In some implementations, device 1000 comprises memory 1030 coupled to processor 1004 via memory interface 1034. Memory 1030 includes memory devices for storing information in device 1000. Memory can include nonvolatile (state does not change if power to the memory device is interrupted) and/or volatile (state is indeterminate if power to the memory device is interrupted) memory devices. Memory device 1030 can be a dynamic random access memory (DRAM) device, a static random access memory (SRAM) device, flash memory device, phase-change memory device, or some other memory device having suitable performance to serve as process memory. In one implementation, memory 1030 can operate as system memory for device 1000, to store data and instructions for use when the one or more processors 1004 executes an application or process. Memory 1030 can store application data, user data, music, photos, documents, or other data, as well as system data (whether long-term or temporary) related to the execution of the applications and functions of device 1000.

Elements of various implementations and examples are also provided as a machine-readable medium (e.g., memory 1030) for storing the computer-executable instructions (e.g., instructions to implement any other processes discussed herein). The machine-readable medium (e.g., memory 1030) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, implementations of the disclosure may be downloaded as a computer program (e.g., BIOS) which may be transferred from a remote computer (e.g., a server) to a requesting computer (e.g., a client) by way of data signals via a communication link (e.g., a modem or network connection).

In some implementations, device 1000 comprises temperature measurement circuitries 1040, e.g., for measuring temperature of various components of device 1000. In an example, temperature measurement circuitries 1040 may be embedded, or coupled or attached to various components, whose temperature are to be measured and monitored. For example, temperature measurement circuitries 1040 may measure temperature of (or within) one or more of cores 1008a, 1008b, 1008c, voltage regulator 1014, memory 1030, a mother-board of SOC 1001, and/or any appropriate component of device 1000.

In some implementations, device 1000 comprises power measurement circuitries 1042, e.g., for measuring power consumed by one or more components of the device 1000. In an example, in addition to, or instead of, measuring power, the power measurement circuitries 1042 may measure voltage and/or current. In an example, the power measurement circuitries 1042 may be embedded, or coupled or attached to various components, whose power, voltage, and/or current consumption are to be measured and monitored. For example, power measurement circuitries 1042 may measure power, current and/or voltage supplied by one or more voltage regulators 1014, power supplied to SOC

1001, power supplied to device 1000, power consumed by processor 1004 (or any other component) of device 1000, etc.

In some implementations, device 1000 comprises one or more voltage regulator circuitries, generally referred to as voltage regulator (VR) 1014. VR 1014 generates signals at appropriate voltage levels, which may be supplied to operate any appropriate components of the device 1000. Merely as an example, VR 1014 is illustrated to be supplying signals to processor 1004 of device 1000. In some implementations, VR 1014 receives one or more Voltage Identification (VID) signals, and generates the voltage signal at an appropriate level, based on the VID signals. Various type of VRs may be utilized for the VR 1014. For example, VR 1014 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some implementations, each processor core has its own VR which is controlled by PCU 1010*a/b* and/or PMIC 1012. In some implementations, each core has a network of distributed LDOs to provide efficient control for power management. The LDOs can be digital, analog, or a combination of digital or analog LDOs.

In some implementations, device 1000 comprises one or more clock generator circuitries, generally referred to as clock generator 1016. Clock generator 1016 generates clock signals at appropriate frequency levels, which may be supplied to any appropriate components of device 1000. Merely as an example, clock generator 1016 is illustrated to be supplying clock signals to processor 1004 of device 1000. In some implementations, clock generator 1016 receives one or more Frequency Identification (FID) signals, and generates the clock signals at an appropriate frequency, based on the FID signals.

In some implementations, device 1000 comprises battery 1018 supplying power to various components of device 1000. Merely as an example, battery 1018 is illustrated to be supplying power to processor 1004. Although not illustrated in the figures, device 1000 may comprise a charging circuitry, e.g., to recharge the battery, based on Alternating Current (AC) power supply received from an AC adapter.

In some implementations, device 1000 comprises Power Control Unit (PCU) 1010 (also referred to as Power Management Unit (PMU), Power Controller, etc.). In an example, some sections of PCU 1010 may be implemented by one or more processing cores 1008, and these sections of PCU 1010 are symbolically illustrated using a dotted box and labelled PCU 1010*a*. In an example, some other sections of PCU 1010 may be implemented outside the processing cores 1008, and these sections of PCU 1010 are symbolically illustrated using a dotted box and labelled as PCU 1010*b*. PCU 1010 may implement various power management operations for device 1000. PCU 1010 may include hardware interfaces, hardware circuitries, connectors, registers, etc., as well as software components (e.g., drivers, protocol stacks), to implement various power management operations for device 1000.

In some implementations, device 1000 comprises Power Management Integrated Circuit (PMIC) 1012, e.g., to implement various power management operations for device 1000. In some implementations, PMIC 1012 is a Reconfigurable Power Management ICs (RPMICs) and/or an IMVP (Intel® Mobile Voltage Positioning). In an example, the PMIC is within an IC chip separate from processor 1004. The may implement various power management operations for device 1000. PMIC 1012 may include hardware interfaces, hardware circuitries, connectors, registers, etc., as well as software components (e.g., drivers, protocol stacks), to implement various power management operations for device 1000.

In an example, device 1000 comprises one or both PCU 1010 or PMIC 1012. In an example, any one of PCU 1010 or PMIC 1012 may be absent in device 1000, and hence, these components are illustrated using dotted lines.

Various power management operations of device 1000 may be performed by PCU 1010, by PMIC 1012, or by a combination of PCU 1010 and PMIC 1012. For example, PCU 1010 and/or PMIC 1012 may select a power state (e.g., P-state) for various components of device 1000. For example, PCU 1010 and/or PMIC 1012 may select a power state (e.g., in accordance with the ACPI (Advanced Configuration and Power Interface) specification) for various components of device 1000. Merely as an example, PCU 1010 and/or PMIC 1012 may cause various components of the device 1000 to transition to a sleep state, to an active state, to an appropriate C state (e.g., C0 state, or another appropriate C state, in accordance with the ACPI specification), etc. In an example, PCU 1010 and/or PMIC 1012 may control a voltage output by VR 1014 and/or a frequency of a clock signal output by the clock generator, e.g., by outputting the VID signal and/or the FID signal, respectively. In an example, PCU 1010 and/or PMIC 1012 may control battery power usage, charging of battery 1018, and features related to power saving operation.

The clock generator 1016 can comprise the phase locked loop (PLL) described herein, frequency locked loop (FLL), or any suitable clock source. In some implementations, each core of processor 1004 has its own clock source. As such, each core can operate at a frequency independent of the frequency of operation of the other core. In some implementations, PCU 1010 and/or PMIC 1012 performs adaptive or dynamic frequency scaling or adjustment. For example, clock frequency of a processor core can be increased if the core is not operating at its maximum power consumption threshold or limit. In some implementations, PCU 1010 and/or PMIC 1012 determines the operating condition of each core of a processor, and opportunistically adjusts frequency and/or power supply voltage of that core without the core clocking source (e.g., PLL of that core) losing lock when the PCU 1010 and/or PMIC 1012 determines that the core is operating below a target performance level. For example, if a core is drawing current from a power supply rail less than a total current allocated for that core or processor 1004, then PCU 1010 and/or PMIC 1012 can temporarily increase the power draw for that core or processor 1004 (e.g., by increasing clock frequency and/or power supply voltage level) so that the core or processor 1004 can perform at a higher performance level. As such, voltage and/or frequency can be increased temporality for processor 1004 without violating product reliability.

In an example, PCU 1010 and/or PMIC 1012 may perform power management operations, e.g., based at least in part on receiving measurements from power measurement circuitries 1042, temperature measurement circuitries 1040, charge level of battery 1018, and/or any other appropriate information that may be used for power management. To that end, PMIC 1012 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 1010 and/or PMIC 1012 in at least one implementation to allow PCU 1010 and/or PMIC 1012 to manage processor core energy at least in part based on value(s) detected by one or more of the sensors.

Also illustrated is an example software stack of device 1000 (although not all elements of the software stack are illustrated). Merely as an example, processors 1004 may execute application programs 1050, Operating System 1052, one or more Power Management (PM) specific application programs (e.g., generically referred to as PM applications 1058), and/or the like. PM applications 1058 may also be executed by the PCU 1010 and/or PMIC 1012. OS 1052 may also include one or more PM applications 1056a, 1056b, 1056c. The OS 1052 may also include various drivers 1054a, 1054b, 1054c, etc., some of which may be specific for power management purposes. In some implementations, device 1000 may further comprise a Basic Input/Output System (BIOS) 1020. BIOS 1020 may communicate with OS 1052 (e.g., via one or more drivers 1054), communicate with processors 1004, etc.

For example, one or more of PM applications 1058, 1056, drivers 1054, BIOS 1020, etc. may be used to implement power management specific tasks, e.g., to control voltage and/or frequency of various components of device 1000, to control wake-up state, sleep state, and/or any other appropriate power state of various components of device 1000, control battery power usage, charging of the battery 1018, features related to power saving operation, etc.

Furthermore, the particular features, structures, functions, or characteristics may be combined in any suitable manner in one or more implementations. For example, a first implementation may be combined with a second implementation anywhere the particular features, structures, functions, or characteristics associated with the two implementations are not mutually exclusive.

While the disclosure has been described in conjunction with specific implementations thereof, many alternatives, modifications and variations of such implementations will be apparent to those of ordinary skill in the art in light of the foregoing description. For example, other memory architectures e.g., Dynamic RAM (DRAM) may use the implementations discussed. The implementations of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example implementations of the disclosure, it should be apparent to one skilled in the art that the disclosure can be practiced without, or with variation of, these specific details. The description is thus to be regarded as illustrative instead of limiting.

The following examples pertain to further implementations. Specifics in the examples may be used anywhere in one or more implementations. All optional features of the apparatus described herein may also be implemented with respect to a method or process.

Example 1 is an apparatus which comprises: first circuitry to use a first reset signal to generate a second reset signal, wherein the first reset signal is to be further provided to reset a phase frequency detector circuit; second circuitry coupled to the first circuitry and comprising: one or more Boolean operators to generate a first signal based on first and second switch control clocks, and a flip-flop circuit configured to output a second signal and a third signal complimentary to the second signal, wherein the second signal is based on the first signal and second reset signal; and wherein the second circuitry is to provide the second and third signal to a reset circuit of a loop filter circuit having a first switch and a second switch each coupled between the reset circuit and a different respective capacitor of the loop filter circuit; and wherein the reset circuit provides a first switch control signal and a second switch control signal respectively to the first and second switches.

Example 2 includes all features of example 1, and wherein the pulse width of the second and third signals corresponds to a duration the reset circuit consumes power performing a reset of the capacitors.

Example 3 includes all features of example 1 or 2, and wherein the first reset signal is based on a phase error between a reference clock and a feedback clock.

Example 4 includes all features of any of example 1-3, and wherein the second reset signal is formed by applying a delay to the first reset signal.

Example 5 includes all features of example 4, and wherein a tunable duration of the delay is pre-determined and results in adding a fixed duration delay to a duration of a phase error between a reference clock and a feedback clock used to form the first reset signal.

Example 6 includes all features of example 4, wherein a tunable duration of the delay is automatically adjusted so that varying delay durations are added to the duration of a phase error between a reference clock and a feedback clock used to form the first reset signal.

Example 7 includes all features of any of examples 1-6, wherein the first capacitor and the second capacitor are each coupled to a charge pump via a first node; and the first capacitor and the second capacitor are coupled in parallel with each other between the first node and a second node.

Example 8 includes all features of example 7, wherein the first switch is coupled to the first capacitor via a third node, wherein a third switch of the loop filter circuit is coupled between the first node and the third node; and the second switch is coupled to the second capacitor via a fourth node, wherein a fourth switch of the loop filter circuit is coupled between the first node and the fourth node.

Example 9 includes all features of example 1, and wherein the power gating pulse circuit comprises a chopper branch to cut-off a pulse width of the pulses of the reset control signals when the phase error extends longer than a threshold and relative to the reference clock.

Example 10 includes an apparatus that comprises: a loop filter to receive input and to output a control signal based on the input, the loop filter comprising capacitors coupled to the input and a reset circuit to reset the capacitors; and a power gating pulse circuit comprising pulse generator circuitry configured to adaptively generate complimentary reset control signals to control the reset circuit, wherein a pulse width of the reset control signals is based on both a phase error between a reference clock and a feedback clock and switch control signals based on the reference clock.

Example 11 includes all features of example 10, wherein the pulse width of the reset control signal corresponds to a duration the reset circuit consumes power performing a reset of the capacitors.

Example 12 includes all features of example 10 or 11, wherein the power gating pulse circuit comprises a delay circuit arranged to apply a delay to a first signal depending on the phase error and generated by a phase frequency detector (PFD), and to generate a second signal, and wherein the pulse generator circuitry uses the second signal to determine the pulse widths of the reset control signals.

Example 13 includes all features of any of examples 10-12, wherein the pulse generator circuit comprises a flip-flop circuitry, and wherein switch control signals are capacitor reset clocks with a pulse width fixed at a proportion of a reference clock and input to the flip-flop circuitry.

Example 14 includes all features of any of examples 10-13, wherein the pulse generator circuit comprises a flip-flop circuitry, and wherein the flip-flop circuitry comprises a D-type flip-flop to be reset by the second signal, receives the switch control signals as input, and outputs the reset control signals.

Example 15 includes all features of examples 10-14, wherein the power gating pulse circuit comprises a Boolean logic circuit that receives the switch control signals, and wherein the pulse generator circuit comprises a flip-flop that receives an input generated by the Boolean logic and outputs the reset control signals.

Example 16 includes all features of example 15, and wherein the Boolean logic comprises an OR gate to receive alternating switch control signals that have pulse widths fixed to a proportion of the reference clock.

Example 17 includes all features of any of examples 10-16, and wherein the switch control signals have pulse widths fixed to a proportion of the reference clock, wherein the pulse generator circuit is a flip-flop circuitry, and wherein the flip-flop circuitry uses the switch control signals to set the start of pulses on the reset control signals, wherein the flip-flop circuitry receives a flip-flop reset signal to set the end of the pulses of the reset control signals, and wherein the flip-flop reset signal being based on detection of the phase error.

Example 18 includes all features of any of examples 10-17, wherein the reset circuit does not have resistors so that the reset circuit resets the capacitors without using resistors.

Example 19 is a system that comprises: memory; processor circuitry forming a processor coupled to the memory, the processor having a loop filter comprising: a first capacitor and a second capacitor each coupled to a charge pump via a first node, wherein the first capacitor and the second capacitor are coupled in parallel with each other between the first node and a second node; a first switch coupled between the first capacitor and the first node; a second switch coupled between the second capacitor and the first node; a reset circuit to receive a first signal and a second signal which is complementary to the first signal, wherein pulse widths of the first and second signals depend on a phase error between clocks used to provide charge from the charge pump; a third switch coupled between the reset circuit and a third node between the first capacitor and the first switch; and a fourth switch coupled between the reset circuit and a fourth node between the second capacitor and the second switch; wherein the reset circuit is configured to provide control signals to the third and fourth switches with timing that depends on the pulse widths; and a wireless interface to allow the processor to communicate with another device.

Example 20 includes all features of claim 19, and wherein the first and second signals are generated by applying a delay to a phase frequency detector reset signal associated with the phase error to generate a flip-flop reset signal, and resetting a flip-flop of a power gating pulse circuit with the flip-flop reset signal.

Example 21 includes all features of claim 20, and wherein the first and second signals are also based on alternating switch control signals based on a reference clock used to detect the phase error.

Example 22 includes all features of any of examples 19-21, and wherein the reset circuit comprises an active element voltage divider with active elements coupled in series and without resistors between the active elements.

Example 23 includes all features of any of examples 19-22, and wherein the reset circuit comprises at least four transistors coupled in series including two inner transistors and two outer transistors, wherein the two inner transistors having gates that receive current from a source-drain coupling between two of the transistors.

Example 24 includes all features of any of examples 19-23, and wherein the reset circuit comprises cascading transistors with a P-type diode-connected transistor in conjunction with an N-type diode-connected transistor, and without the use of resistors between the transistors.

Example 25 includes all features of any of examples 19-23, and wherein the reset circuit comprises a P-type transistor and an N-type transistor in saturation mode, and without the use of resistors between the transistors.

I claim:

1. An apparatus comprising:
    first circuitry to use a first reset signal to generate a second reset signal, wherein the first reset signal is to be further provided to reset a phase frequency detector circuit;
    second circuitry coupled to the first circuitry and comprising:
    a Boolean logic circuit to generate a first signal based on first and second reset control signals, and
    a flip-flop circuit configured to output a second signal and a third signal complimentary to the second signal, wherein the second signal is based on the first signal and second reset signal; and
    wherein the second circuitry is to provide the second and third signal to a reset circuit of a loop filter circuit having a first switch and a second switch each coupled between the reset circuit and a different respective capacitor of first and second capacitors of the loop filter circuit; and
    wherein the reset circuit provides the first and second reset control signals respectively to the first and second switches.

2. The apparatus of claim 1, wherein the pulse width of the second and third signals corresponds to a duration the reset circuit consumes power performing a reset of the capacitors.

3. The apparatus of claim 1, wherein the first reset signal is based on a phase error between a reference clock and a feedback clock.

4. The apparatus of claim 3, wherein the flip-flop circuit comprises a chopper branch to cut-off a pulse width of the second and third signals when the phase error extends longer than a threshold and relative to the reference clock.

5. The apparatus of claim 1, wherein the second reset signal is formed by applying a delay to the first reset signal.

6. The apparatus of claim 5, wherein a tunable duration of the delay is pre-determined and results in adding a fixed duration delay to a duration of a phase error between a reference clock and a feedback clock used to form the first reset signal.

7. The apparatus of claim 5, wherein a tunable duration of the delay is automatically adjusted so that varying delay durations are added to the duration of a phase error between a reference clock and a feedback clock used to form the first reset signal.

8. The apparatus of claim 1, wherein the first capacitor and the second capacitor are each coupled to a charge pump via a first node; and the first capacitor and the second capacitor are coupled in parallel with each other between the first node and a second node.

9. The apparatus of claim 8, wherein the first switch is coupled to the first capacitor via a third node, wherein a third switch of the loop filter circuit is coupled between the first node and the third node; and the second switch is coupled to the second capacitor via a fourth node, wherein a fourth switch of the loop filter circuit is coupled between the first node and the fourth node.

10. An apparatus comprising:
a loop filter to receive input and to output a control signal based on the input, the loop filter comprising capacitors coupled to the input and a reset circuit to reset the capacitors; and
a power gating pulse circuit comprising pulse generator circuitry configured to adaptively generate complimentary reset control signals to control the reset circuit, wherein a pulse width of the reset control signals is based on both a phase error between a reference clock and a feedback clock and switch control signals based on the reference clock.

11. The apparatus of claim 10, wherein the pulse width of the reset control signal corresponds to a duration the reset circuit consumes power performing a reset of the capacitors.

12. The apparatus of claim 10, wherein the power gating pulse circuit comprises a delay circuit arranged to apply a delay to a first signal depending on the phase error and generated by a phase frequency detector (PFD), and to generate a second signal, and wherein the pulse generator circuitry uses the second signal to determine the pulse widths of the reset control signals.

13. The apparatus of claim 10, wherein the pulse generator circuit comprises a flip-flop circuitry, and wherein the switch control signals are capacitor reset clocks with a pulse width fixed at a proportion of a reference clock and input to the flip-flop circuitry.

14. The apparatus of claim 10, wherein the pulse generator circuit comprises a flip-flop circuitry, and wherein the flip-flop circuitry comprises a D-type flip-flop to receive the switch control signals as input, and outputs the reset control signals.

15. The apparatus of claim 10, wherein the power gating pulse circuit comprises a Boolean logic circuit that receives the switch control signals, and wherein the pulse generator circuit comprises a flip-flop that receives an input generated by the Boolean logic and outputs the reset control signals.

16. The apparatus of claim 15, wherein the Boolean logic comprises an OR gate to receive alternating switch control signals that have pulse widths fixed to a proportion of the reference clock.

17. The apparatus of claim 10 wherein the switch control signals have pulse widths fixed to a proportion of the reference clock, wherein the pulse generator circuit is a flip-flop circuitry, and wherein the flip-flop circuitry uses the switch control signals to set the start of pulses on the reset control signals, wherein the flip-flop circuitry receives a flip-flop reset signal to set the end of the pulses of the reset control signals, and wherein the flip-flop reset signal being based on detection of the phase error.

18. The apparatus of claim 10, wherein the reset circuit does not have resistors so that the reset circuit resets the capacitors without using resistors.

19. A system comprising:
memory;
processor circuitry forming a processor coupled to the memory, the processor having a loop filter comprising:
a first capacitor and a second capacitor each coupled to a charge pump via a first node, wherein the first capacitor and the second capacitor are coupled in parallel with each other between the first node and a second node;
a first switch coupled between the first capacitor and the first node;
a second switch coupled between the second capacitor and the first node;
a reset circuit to receive a first signal and a second signal which is complementary to the first signal, wherein pulse widths of the first and second signals depend on a phase error between clocks used to provide charge from the charge pump;
a third switch coupled between the reset circuit and a third node between the first capacitor and the first switch; and
a fourth switch coupled between the reset circuit and a fourth node between the second capacitor and the second switch;
wherein the reset circuit is configured to provide control signals to the third and fourth switches; and
a wireless interface to allow the processor to communicate with another device.

20. The system of claim 19 wherein the first and second signals are generated by applying a delay to a phase frequency detector reset signal associated with the phase error to generate a flip-flop reset signal, and resetting a flip-flop of a power gating pulse circuit with the flip-flop reset signal.

21. The system of claim 20 wherein the first and second signals are also based on alternating switch control signals based on a reference clock used to detect the phase error.

22. The system of claim 19 wherein the reset circuit comprises an active element voltage divider with active elements coupled in series and without resistors between the active elements.

23. The system of claim 19 wherein the reset circuit comprises at least four transistors coupled in series including two inner transistors and two outer transistors, wherein the two inner transistors having gates that receive current from a source-drain coupling between two of the transistors.

24. The system of claim 19 wherein the reset circuit comprises cascading transistors with a P-type diode-connected transistor in conjunction with an N-type diode-connected transistor, and without the use of resistors between the transistors.

25. The system of claim 19 wherein the reset circuit comprises a P-type transistor and an N-type transistor in saturation mode, and without the use of resistors between the transistors.

* * * * *